(12) United States Patent
Yamashita et al.

(10) Patent No.: US 7,507,346 B2
(45) Date of Patent: Mar. 24, 2009

(54) METHOD FOR MANUFACTURING ELECTRONIC COMPONENT, AND ELECTRONIC COMPONENT

(75) Inventors: Muneharu Yamashita, Toyama (JP); Atsushi Mikado, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/020,729

(22) Filed: Jan. 28, 2008

(65) Prior Publication Data
US 2008/0113164 A1    May 15, 2008

Related U.S. Application Data

(63) Continuation of application No. PCT/JP2006/309724, filed on May 16, 2006.

(30) Foreign Application Priority Data
Aug. 5, 2005    (JP)    ............................ 2005-228243

(51) Int. Cl.
*H01L 21/302* (2006.01)
(52) U.S. Cl. .................. 216/2; 216/11; 216/13; 216/18; 216/33; 216/36; 216/52; 216/53; 216/58; 216/83; 438/51; 438/118; 438/460; 29/832; 29/835; 451/41
(58) Field of Classification Search ........................ 216/2
See application file for complete search history.

(56) References Cited

U.S. PATENT DOCUMENTS 6,744,122 B1    6/2004   Hashimoto
2002/0187593 A1*  12/2002  Walker et al. ............... 438/149

FOREIGN PATENT DOCUMENTS

JP   2001-124794 A    5/2001
JP   2004-311574 A    11/2004
JP   2004-340730 A    12/2004

OTHER PUBLICATIONS

Official communication issued in the International Application No. PCT/JP2006/309724, mailed on Aug. 8, 2006.

* cited by examiner

*Primary Examiner*—Anita K Alanko
(74) *Attorney, Agent, or Firm*—Keating & Bennett, LLP

(57) ABSTRACT

A method for manufacturing an electronic component includes preparing an element substrate having a function section for providing a function of an electronic component, and an external-connection electrode; bonding a low-sandblast-resistant case plate to the element substrate through a high-sandblast-resistant adhesive layer; forming, by sandblast processing, a hole in the case plate above the external-connection electrode so that the adhesive layer is exposed to the outside; removing, by etching, an adhesive layer portion that is exposed in the hole; forming an electrode film so as to be electrically connected to the exposed external-connection electrode; and forming, by mechanical machining, a projection having a leading end surface on which a terminal electrode resulting from the electrode film is defined.

7 Claims, 8 Drawing Sheets

METHOD FOR MANUFACTURING ELECTRONIC COMPONENT, AND ELECTRONIC COMPONENT

BACKGROUND OF THE INVENTION

1. Field of the Invention

The present invention relates to an electronic component having a laminate in which an element substrate defining an electronic component element is bonded to a case plate using an adhesive. More specifically, the present invention relates to a method for manufacturing an electronic component in which an electrical connection structure between an electrode on the element substrate and an electrode on the case plate, and an electrical connection structure between the electronic component and an external device are improved, and also relates to the electronic component.

2. Description of the Related Art

Various semiconductor sensor devices in which a sensor having a three-dimensional structure is defined on a semiconductor substrate have been proposed. Such semiconductor sensor devices have a moving section, and need to be manufactured and mounted so as not to impede the movement of the moving section. Therefore, for example, a method in which the semiconductor substrate is accommodated in a ceramic package and the ceramic package is mounted on a mounting substrate and is bonded using a bonding wire has been used. However, due to the need for a ceramic package, this method inevitably causes an increase in size. Furthermore, the mounting on the mounting substrate using the bonding wire inevitably requires a large mounting space. In particular, a semiconductor sensor device having a large number of sections electrically connected to external devices requires a large mounting space based on a bonding wire on a mounting substrate.

Japanese Unexamined Patent Application Publication No. 2004-340730 discloses a semiconductor device 101 shown in FIG. 10. The semiconductor device 101 has a base substrate 102. A semiconductor substrate 103 including a semiconductor sensor is fixed on the base substrate 102. The semiconductor substrate 103 has a moving section including an electrode 103a. Although schematically shown in FIG. 10, a sensor section including the electrode 103a is a moving section. A recess is formed in a surface 103b of the semiconductor substrate 103 to define a gap A that faces the moving section of the semiconductor substrate 103. The semiconductor substrate 103 is fixed to the base substrate 102 so that the surface 103b having the recess defines a lower surface of the semiconductor substrate 103.

Electrodes 103c and 103d disposed on the semiconductor substrate 103 are bonded and electrically connected to electrodes 102a and 102b on the base substrate 102. The electrodes 102a and 102b are electrically connected to electrodes 102c and 102d disposed on a lower surface of the base substrate 102 via through-hole electrodes provided in the base substrate 102. Solder bumps 104 and 105 are bonded to the electrodes 102c and 102d.

Side and upper surfaces of the semiconductor substrate 103 are sealed by a mold resin 106. The semiconductor substrate 103 is hermetically sealed by the base substrate 102 and the mold resin 106.

The semiconductor device 101 is mounted on a mounting substrate by mounting the solder bumps 104 and 105 on electrode lands on the mounting substrate. Therefore, the semiconductor device 101 can be mounted in a small mounting space on the mounting substrate.

In the semiconductor device 101 described in Japanese Unexamined Patent Application Publication No. 2004-340730, as described above, the semiconductor substrate 103 having a moving section is hermetically sealed by the base substrate 102 and the mold resin 105, and can be mounted on a substrate by a flip-chip bonding technique using the solder bumps 104 and 105. In this case, a relatively low bonding strength is obtained using the solder bumps 104 and 105. Therefore, it is necessary to fill an adhesive of epoxy resin or other suitable material, called an underfill, between the mounting substrate and the base substrate 102 to increase the adhesion strength.

As a result, the spacing between the mounting substrate and the base substrate 102 is filled with the underfill as well as the solder bumps 104 and 105. Stress applied to the mounting substrate is transmitted to the base substrate 102 through the solder bumps 104 and 105 and through the underfill, and consequently, to the semiconductor substrate 103. The influence of the stress, therefore, may cause the semiconductor sensor defined on the semiconductor substrate 103 to malfunction.

SUMMARY OF THE INVENTION

To overcome the problems described above, preferred embodiments of the present invention provide a method for manufacturing an electronic component that prevents transmission of stress from outside after the electronic component is mounted on a mounting substrate, that can be surface-mounted in a relatively small mounting space, that has a simple structure, and that can increase insulation resistance between a plurality of external-connection terminals, and the electronic component.

A preferred embodiment of the present invention provides a method for manufacturing an electronic component, including a step of preparing an element substrate having a function section for providing a function of an electronic component and an external-connection electrode defined on a surface thereof for electrically connecting the function section to an external device; a step of bonding a relatively-low-sandblast-resistant case plate to the element substrate using a relatively-high-sandblast-resistant adhesive; a step of forming, by sandblast processing, a hole in the case plate so that the adhesive is exposed on a portion of the hole beneath which a portion of the external-connection electrode is defined; a step of removing, by etching, an adhesive portion that is exposed in the hole and that is not removed by the sandblast processing to expose the external-connection electrode; a step of forming an electrode film so that the electrode film extends on an inner surface of the hole from an outer surface of the case plate and so that the electrode film is electrically connected to the external-connection electrode exposed by removing the adhesive; and a step of forming, by mechanical processing, a projection on the outer surface of the case plate, the projection having a leading end surface on which the electrode film extends.

The method for manufacturing an electronic component according to this preferred embodiment preferably further includes a step of, before forming the electrode film, roughening at least a portion of the case plate at which the electrode film is defined.

In this preferred embodiment, the etching is preferably performed by dry etching.

In addition, a polyimide-based adhesive is preferably used as the adhesive.

The method according to this preferred embodiment preferably further includes a step of dicing a laminate of the element substrate and the case plate so that the hole is divided, and forming a recess in a side surface of the projection, the recess being formed of a portion of an inner peripheral surface of the hole.

The method preferably further includes a step of laminating a second case plate on a surface opposite to the side of the element substrate on which the case plate is adhered.

In the method according to this preferred embodiment, the second case plate is preferably bonded to the element substrate by an adhesive.

An electronic component according to another preferred embodiment of the present invention includes an element substrate having a function section functioning as an electronic component element; an adhesive layer disposed on a surface of the element substrate; and a case plate made of a material having a lower sandblast resistance than the adhesive layer and bonded to the case plate by the adhesive layer, wherein an external-connection electrode electrically connected to an external device is defined on the surface of the element substrate on which the case plate is laminated, the case plate includes a hole having a bottom portion on which the adhesive layer is not disposed so that at least a portion of the external-connection electrode is exposed, a projection having an outer surface to which the electrode film is applied is defined on a surface opposite to the side of the case plate on which the element substrate is laminated, a portion of a side surface of the projection being defined by an inner peripheral surface of the hole, and an electrode film is arranged so that the electrode film extends on the external-connection electrode exposed in the hole from a leading end of the projection through the side surface of the projection.

In the method for manufacturing an electronic component according to preferred embodiments of the present invention, an element substrate having a function section for providing a function of an electronic component, and an external-connection electrode defined on a surface of the element substrate for electrically connecting the function section to an external device are prepared; and after a case plate is bonded to a surface of the element substrate on which the external-connection electrode is defined using a relatively-high-sandblast-resistant adhesive, a hole is formed by sandblast processing so that an adhesive layer is exposed on a portion of the hole beneath which a portion of the external-connection electrode is defined. Since the adhesive layer has a high sandblast resistance, the sandblast processing is performed so that the adhesive layer is not completely removed and so that a hole is formed in the case plate, thereby performing the sandblast processing so that the adhesive layer can be exposed on a bottom portion of the hole.

Then, an adhesive portion that is exposed in the hole and that is not removed by the sandblast processing is removed by etching. In this manner, the adhesive layer on the bottom portion is removed, and a portion of the external-connection electrode on the element substrate is exposed in the hole.

An electrode film is formed so that the electrode film extends on an inner surface of the hole from an outer surface of the case plate and so that the electrode film is electrically connected to the external-connection electrode on the element substrate exposed by removing the adhesive portion, thereby electrically connecting the function section on the element substrate to the electrode film defined on the outer surface of the case plate. Furthermore, a projection having a side surface including a portion of which is formed of an inner peripheral surface of the hole and having a leading end surface on which the electrode film extends is formed on an outer surface of the case plate by mechanical machining. Therefore, the electronic component according to preferred embodiments of the present invention can be electrically connected to an electrode land on a mounting surface using an electrode film portion on the leading end surface of the projection.

Thus, according to preferred embodiments of the present invention, an electronic component that can be surface-mounted so that the projection is brought into abutment with the electrode land on the mounting substrate is provided. In addition, the electronic component can be mounted using the projection that is integrally made with the case, without using an underfill or other filler material.

Therefore, preferred embodiments of the present invention not only enable high-density mounting, but also prevent transmission of stress from the mounting substrate.

Since the projection is integrally formed with the case plate by machining the case plate, the projection is not easily removed from the case plate. Thus, the use of an underfill can be omitted. No transmission of stress through an underfill occurs, and stress from the mounting substrate is transmitted only through the projection. Therefore, the transmission of stress from the mounting substrate to the function section on the element substrate is prevented.

In addition, no underfill is required, which simplifies the processing steps for mounting the electronic component on the mounting substrate. Moreover, the projection is preferably formed by mechanical machining, to easily form a plurality of projections having a uniform height. Therefore, a chip-size-package (CSP) electronic component with a high mounting quality is provided.

Furthermore, in the sandblast processing, the sandblast processing is performed such that the adhesive layer is not completely removed. Since the element substrate is not subjected to the sandblast processing, there is no concern that the hole is formed in the element substrate. Thus, the electrode film extending on the inner surface of the hole from the outer surface of the case plate may not be formed in a side surface of the element substrate. For example, if the element substrate is a semiconductor substrate, an electrode defined at an undesired position on a side surface of the semiconductor substrate might change the insulation resistance and disrupt the balance of a bridge to cause variations in an offset voltage or change of the absolute resistance value, resulting in variations in the sensitivity to acceleration or degradation of the device characteristics. The present invention, on the other hand, does not cause such variations of the characteristics.

Therefore, according to preferred embodiments of the present invention, a CSP electronic component that has less variation in an offset voltage or in a sensitivity characteristic to acceleration caused by outside stresses, that can be mounted in a small mounting space on a mounting substrate, and that does not use an underfill is easily provided.

If the method further includes the step of before forming the electrode film, roughening at least a portion of the case plate at which the electrode film is defined, the adhesion strength of the electrode film to the surface of the case plate is further increased.

If the etching is performed by dry etching, undesired corrosion at a portion that defines the external-connection electrode and function section defined on the element substrate is prevented, and the adhesive layer can be partially removed.

If a polyimide-based adhesive is used as the adhesive, due to the high sandblast resistance of the polyimide-based adhesive, a machining condition in which the adhesive is not completely removed can easily be set in the sandblast processing.

If a laminate of the element substrate and the case plate is diced so that the hole is divided and a recess is formed in a side surface of the projection, the recess being defined by a portion of an inner peripheral surface of the hole, according to preferred embodiments of the present invention, an electronic component in which a recess is provided in an outer side surface of a projection and the recess includes an electrode film is provided. A portion in which the projection is provided corresponds to a portion to be bonded to an electrode land on a mounting substrate, and the projection is located at a position near an outer edge of the electronic component. Therefore, a compact electronic component that can be surface-mounted is provided.

If a second case plate is laminated on a surface opposite to the side of the element substrate on which the case plate is adhered, both surfaces of the element substrate can be sealed by the case plate and the second case plate. Therefore, an electronic component having outstanding environmental resistance and/or moisture resistance is achieved.

If the second case plate is bonded to the element substrate using an adhesive, the second case plate can be easily laminated on and bonded to the element substrate.

In the electronic component according to preferred embodiments of the present invention, a case plate is bonded to an element substrate through an adhesive layer. The case plate has a lower sandblast resistance than the adhesive layer. When a hole is formed by sandblast processing according to the method for manufacturing an electronic component of preferred embodiments of the present invention, the sandblast processing can be easily performed so that the adhesive layer remains on a bottom portion of the hole. Then, according to preferred embodiments of the present invention, only an adhesive portion exposed on the bottom portion of the hole can be easily removed by etching. By forming an electrode film on an outer surface of the case plate so that the electrode film extends on the bottom portion of the hole, the electrode film can be bonded to the external-connection electrode exposed on the bottom portion of the hole.

In the electronic component of preferred embodiments of the present invention, after a projection is formed, an electrode film is formed so that the electrode film extends on the external-connection electrode from a leading end surface of the projection. Therefore, a CSP electronic component that can be surface-mounted on a mounting substrate using the projection and that is less influenced by stress from the mounting substrate is provided.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

The present invention will be described with reference to the description of specific preferred embodiments of the present invention with reference to the drawings.

Figure 2:
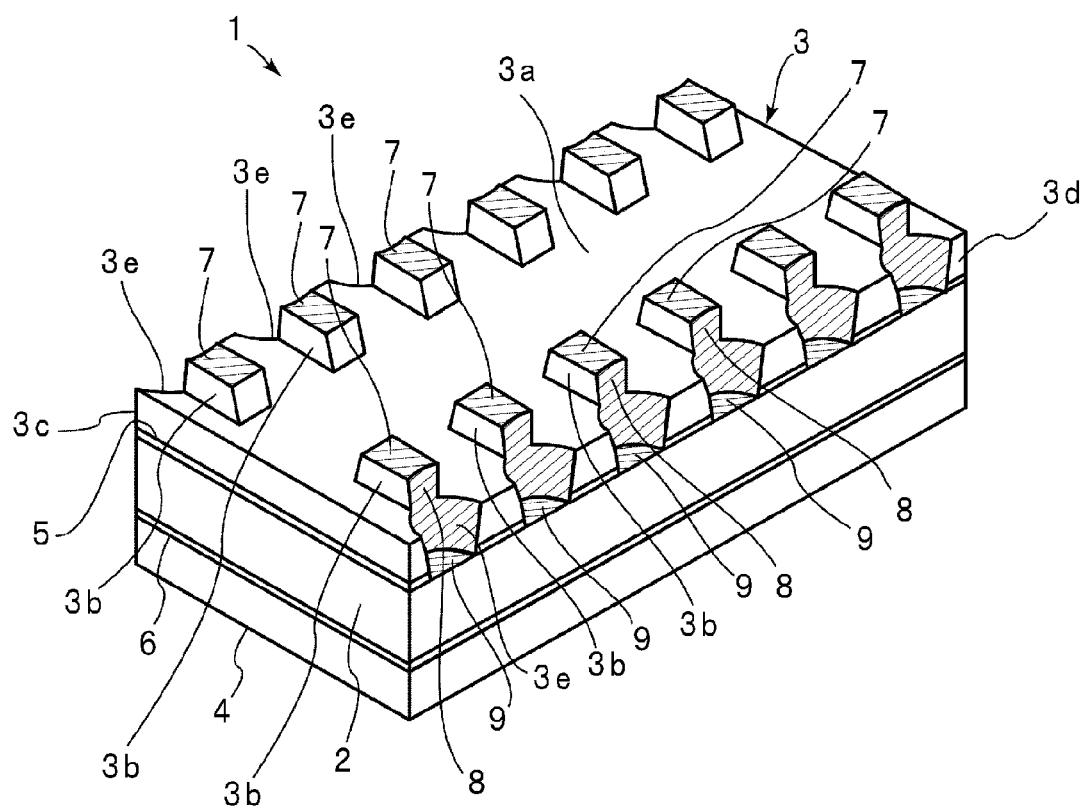
FIG. 2 is a perspective view showing an outer appearance of a semiconductor sensor device according to a preferred embodiment of an electronic component of the present invention.
Figure 3:
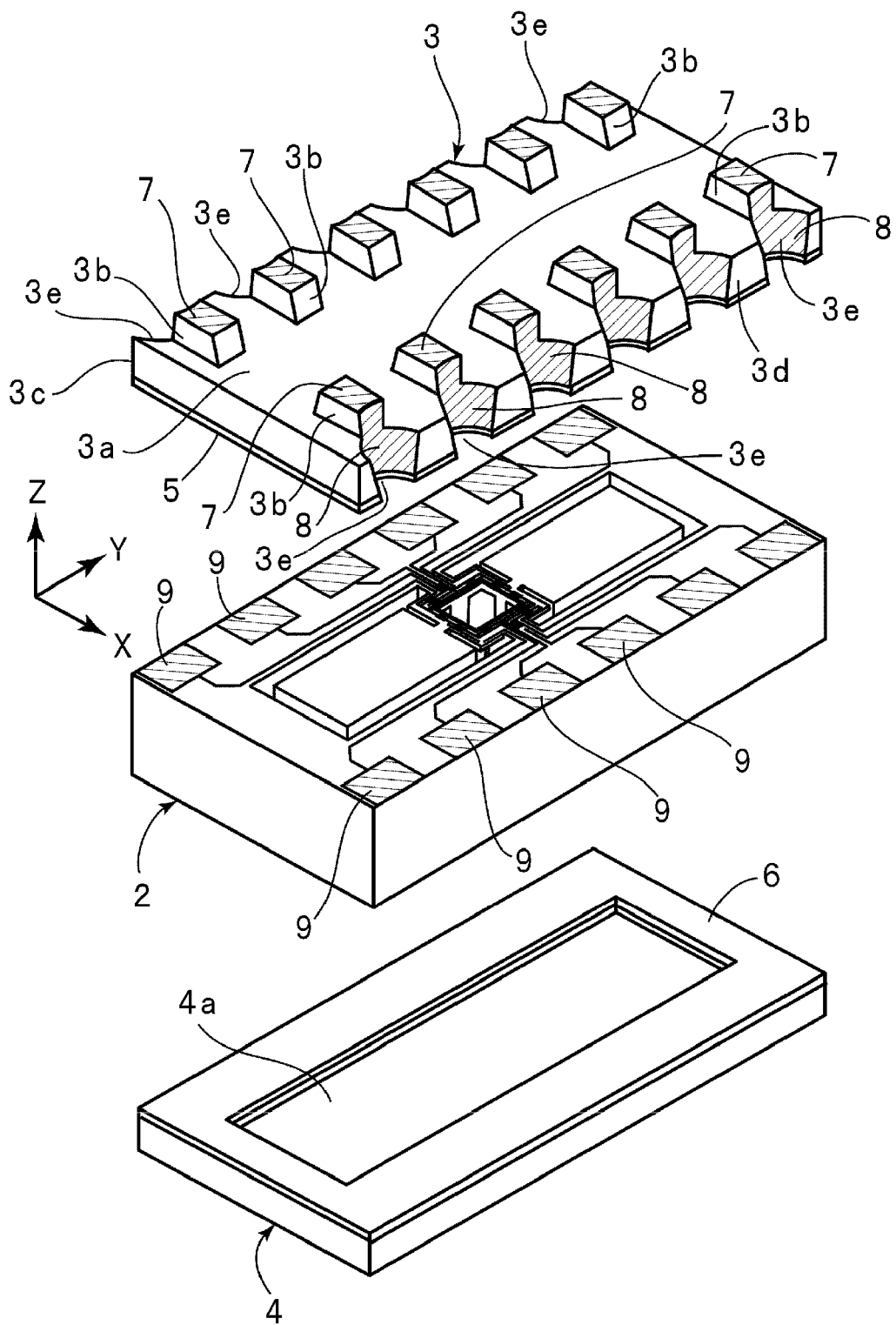
FIG. 3 is an exploded perspective view of the semiconductor sensor device of the preferred embodiment shown in FIGS. 1A to 1E.

In a preferred embodiment, a semiconductor sensor device shown in a perspective view of FIG. 2 is manufactured as an electronic component. FIG. 3 is an exploded perspective view of the semiconductor sensor device shown in FIG. 2. Prior to describing a manufacturing method of this preferred embodiment, a schematic structure of the semiconductor sensor device will first be described.

A semiconductor sensor device 1 includes a semiconductor substrate 2 defining an element substrate, a case plate 3 laminated on a surface of the semiconductor substrate 2, and a second case plate 4 defined on a surface opposite thereto of the semiconductor substrate 2.

In this preferred embodiment, the semiconductor substrate 2 includes an acceleration sensor defined by a semiconductor sensor including a moving section. The acceleration sensor is capable of detecting acceleration in three axial directions that are substantially perpendicular to each other, namely, X-axis, Y-axis, and Z-axis directions. A direction orthogonal to the semiconductor substrate 2, which is preferably substantially rectangular plate, is set to the Z-axis direction, and directions of longer sides and shorter sides of the semiconductor substrate 2, as viewed in plan view, are set to the Y-axis and X-axis directions, respectively. The semiconductor substrate 2 has upper and lower surfaces that are substantially parallel to the XY plane.

The structure of the semiconductor sensor on the semiconductor substrate 2 is not limited to a specific one, and the structure of the acceleration sensor on the semiconductor substrate 2 will be briefly described below.

The case plate 3 is adhered to the semiconductor substrate 2 by an adhesive layer 5. As an adhesive of the adhesive layer 5, an adhesive having a higher sandblast resistance than the case substrate 3 is preferably used. Thus, when a hole is formed in the case substrate 3 by sandblast processing, which will be described below, the adhesive layer 5 is prevented from being completely removed on a bottom portion of the hole. The adhesive layer 5 functions as a stopper in the sandblast processing. As an adhesive of the adhesive layer 5, a polyimide-based adhesive, an epoxy-based adhesive layer, or other suitable adhesive is used, and, preferably, a polyimide-based adhesive with a high sandblast resistance is used.

As shown in FIG. 3, a recess 4a is provided in an upper surface of the second case plate 4. The recess 4a is disposed so as to define a gap to enable movement of a moving section 2a of the acceleration sensor of the semiconductor substrate 2.

Although not clearly shown in FIGS. 2 and 3, a similar recess is also disposed in a lower surface of the case plate 3. Therefore, gaps are provided above and below the acceleration sensor of the semiconductor substrate 2 so as not to impede the movement of the moving section 2a of the semiconductor sensor.

The case plate 3 and the second case plate 4 preferably have substantially the same planar shape, i.e., substantially the same rectangular plate shape, as the semiconductor substrate. In this preferred embodiment, the case plate 3 and the second case plate 4 are preferably made of heat-resistant glass.

The material of the case plates 3 and 4 is not limited to heat-resistant glass, and may include any appropriate synthetic material such as an insulating ceramic such as alumina or a synthetic resin. In preferred embodiments of the present invention, it is necessary that the case plate 3 has a lower sandblast resistance than the adhesive layer 5 described above.

The semiconductor sensor device 1 may be mounted on a mounting substrate by, preferably, a reflow soldering method or other suitable method. Thus, preferably, the case plates 3 and 4 are made of high-heat-resistant heat-resistant glass or ceramic.

The case plate 4 is not necessarily composed of a low-sandblast-resistant material.

The case plate 3 preferably has a substantially rectangular plate configuration, and includes a plurality of projections 3b on a surface 3a opposite to the side of the case plate 3 that is laminated on the semiconductor substrate 2. The projections 3b are made of the same material as the case plate 3 and are integrally formed therewith. As described below, the plurality of projections 3b are formed by mechanically machining the material of the case plate 3. Since the plurality of projections 3b are made of the same material as the case plate 3 and are integrally formed therewith, the projections 3b are not easily removed from the case plate 3.

Side surfaces 3c and 3d that extend along a pair of long sides of the case plate 3 include a plurality of recesses 3e. The plurality of recesses 3e are disposed so as to correspond to the side surfaces of the plurality of projections 3b. A terminal electrode 7 is provided on a leading end of each of the projections 3b. Each of the recesses 3e includes a connection electrode 8 therein. The connection electrodes 8 are connected to the terminal electrodes 7, and extend on the inner surfaces of the recesses 3e through the side surfaces of the projections 3b and to the lower surface of the case plate 3.

As shown in FIG. 3, on the upper surface of the semiconductor substrate 2, a plurality of external-connection electrodes 9 for electrically connecting the acceleration sensor to an external device are provided. The external-connection electrodes 9 are connected to the connection electrodes 8.

Therefore, the acceleration sensor is electrically connected to the terminal electrodes 7 provided on the projections 3b of the case plate 3.

Furthermore, the surface on which the terminal electrodes 7 and the connection electrodes 8 are provided is roughened with, preferably, a surface roughness in a range between about #200 and about #2000 inclusive, and more preferably, a surface roughness of about #600. Such a rough surface increases the adhesion strength of the terminal electrodes 7 and connection electrodes 8 provided thereon.

Next, a method for manufacturing the semiconductor device 1 will be described with reference to FIGS. 1A to 1E.

Figure 1:
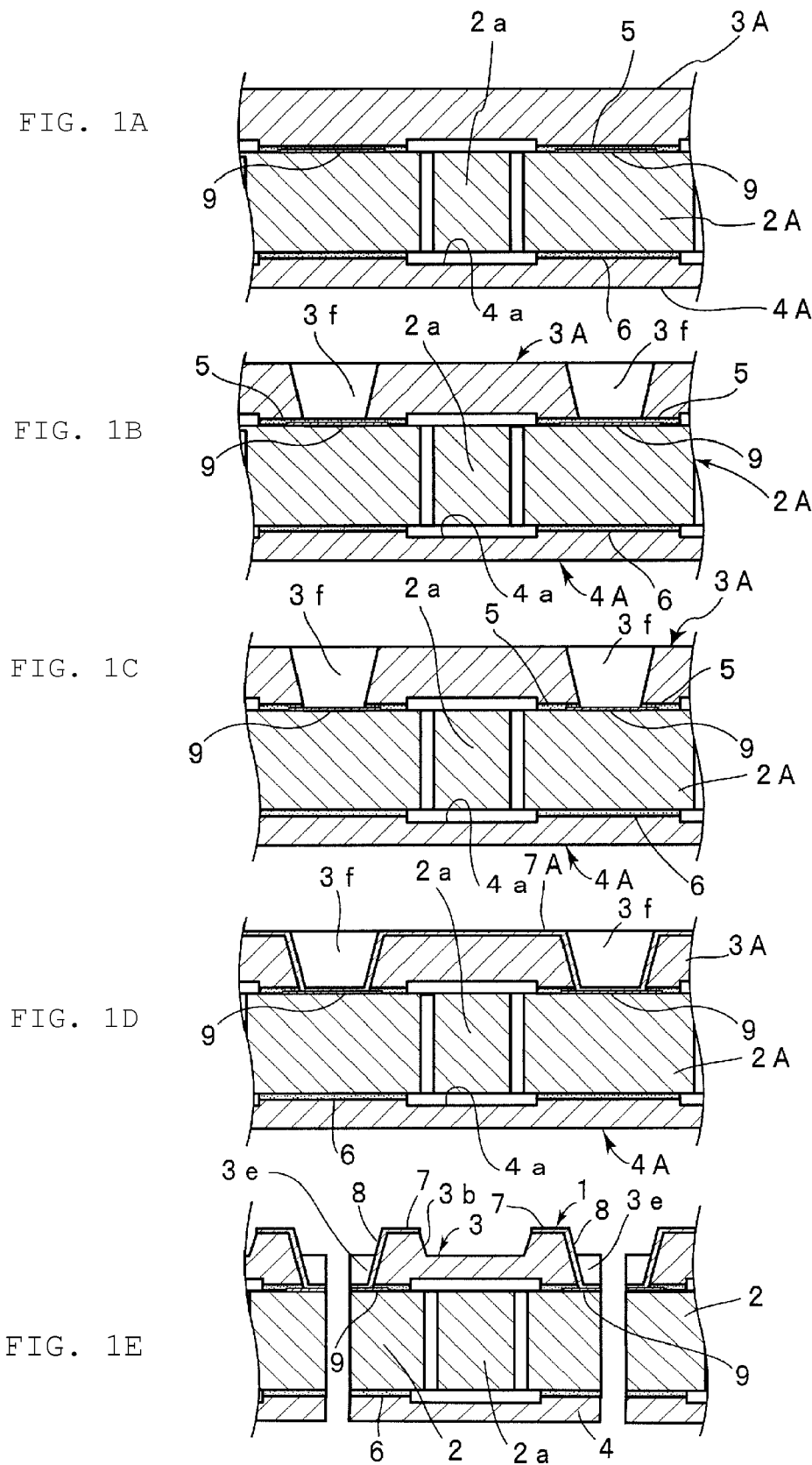
FIGS. 1A to 1E are cross-sectional views showing a process for manufacturing a semiconductor sensor device of a first preferred embodiment.

As shown in FIG. 1A, a semiconductor substrate 2A defining an element substrate is prepared. Case plates 3A and 4A are laminated above and below the semiconductor substrate 2A with adhesive layers 5 and 6 there between, respectively, and are bonded.

Thereafter, as shown in FIG. 1B, holes 3f are formed at positions beneath which the external-connection electrodes 9 are provided from an upper surface of the case plate 3A by a sandblasting method. In this case, the sandblast resistance of the adhesive layer 5 after curing is greater than the sandblast resistance of the case plate 3A. Thus, the sandblast processing is performed so that the adhesive layer 5 is not completely removed on the bottom portions of the holes 3f by the sandblast processing. Therefore, as shown in FIG. 1B, the holes 3f are defined by the sandblast processing while the adhesive layer 5 remains on the bottom portions of the holes 3f.

The holes 3f are tapered so as to reduce a diameter thereof toward a lower surface of the case plate 3A from the upper surface thereof. In the formation of the holes 3f, a taper is normally formed by sandblast processing. The holes 3f may not be tapered. However, the formation of a taper is effective to prevent breakage of an electrode film, which will be described below, at upper opening edges of the holes 3f.

Then, the adhesive layer 5 exposed on the bottom portions of the holes 3f is removed by etching. The etching is performed by dry etching or wet etching. Preferably, dry etching is used in order to prevent corrosion of the external-connection electrodes 9 exposed on the bottom portions of the holes 3f. The semiconductor sensor defines the functional section.

By performing dry etching, as shown in FIG. 1C, adhesive layer portions that are exposed on the bottom portions of the holes 3f are removed, and the external-connection electrodes 9 are exposed.

That is, the holes 3f are disposed at positions at which the external-connection electrodes 9 are located beneath the adhesive layer that is exposed on the bottom portions of the holes 3f. Therefore, when a portion of the adhesive layer is removed by the etching described above, the external-connection electrodes 9 located beneath the adhesive layer 5 are exposed.

Thereafter, an electrode film 7A shown in FIG. 1D is formed on the upper surface of the case plate 3A. In this case, the electrode film 7A is formed by an appropriate method such as sputtering or vapor deposition.

As shown in FIG. 1D, the electrode film 7A is formed so that the electrode film 7A extends on the inner surfaces of the holes 3f from the upper surface of the case plate 3A and so that the electrode film 7A is electrically connected to the external-connection electrodes 9 exposed on the bottom portions of the holes 3f. As described above, since the holes 3f are tapered, the electrode film 7A at the upper opening edges of the holes 3f is not likely to be broken. Thus, as described above, the holes 3f are preferably tapered.

After the electrode film 7A is formed as described above, an electrically conductive adhesive or other suitable material may further be filled in the holes 3f to reinforce the electrically connected portions and to improve electrical connection reliability.

Preferably, after the electrode film 7A is formed, a plating film is formed on the electrode film 7A. The plating film is formed by plating Sn or solder to improve solderability when the semiconductor device of this preferred embodiment is surface-mounted. However, the plating film may not necessarily be formed. For example, when an electrically conductive paste is used for mounting, the plating film may not be provided.

Then, as shown in FIG. 1E, mechanical machining such as grinding is performed using a dicer or other suitable grinder to form a plurality of projections 3b on an upper surface of a mother laminate. The projections 3b are formed by performing grinding so that the plurality of projections 3b protruding on the upper surface of the case plate 3A remain. Therefore, the projections 3b are made of the same material as the case plate 3A and are integrally formed therewith.

Furthermore, the projections 3b are formed so that a portion of the electrode film 7A remains at the leading end surfaces of the projections 3b and so that the electrode film 7A extends on the bottom portions of the holes 3f from the leading end surfaces of the projections 3b through the side surfaces thereof. That is, the projections 3b are defined on an inside side of a portion at which the holes 3f are provided. Since the projections 3b are disposed inside the recesses 3e that are opened along the outer peripheral side edges of the case plate 3 of the semiconductor sensor device 1 that is finally obtained by dicing, the term "inside" means the inside of the finally obtained individual semiconductor sensor device 1.

Figure 4:
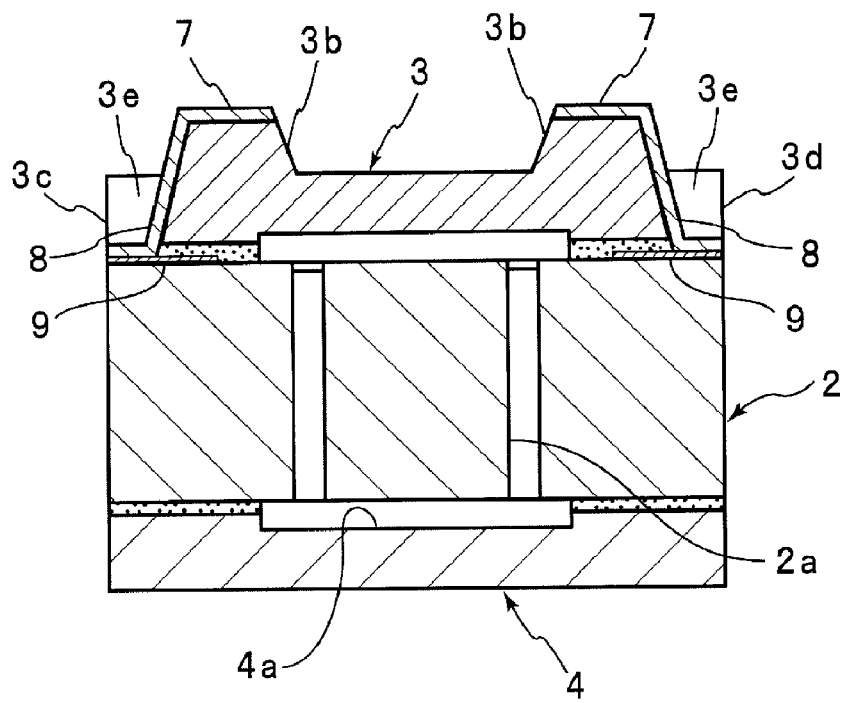
FIG. 4 is a longitudinal sectional view of the semiconductor sensor device of the preferred embodiment shown in FIGS. 1A to 1E.

Then, the mother laminate is diced, and the individual semiconductor sensor device 1 as shown in FIGS. 1E and 4 is obtained. The dicing operation is performed by removing a portion of the mother laminate along the center portions of the holes 3f. By performing the dicing operation, the electrode film 7A is cut and the terminal electrodes 7 and the connection electrodes 8 continuous to the terminal electrodes 7 are formed. In this manner, a structure in which the recesses 3e obtained by the cutting of the holes 3f are disposed outside the projections 3b and in which the connection electrodes 8 are disposed in the recesses 3e is obtained. That is, the semiconductor sensor device 1 in which the recesses 3e are disposed in the outer side surfaces of the projections 3b is easily obtained.

As is apparent from the manufacturing method described above, in this preferred embodiment, the adhesive layer 5 with a relatively high sandblast resistance is used for the case plate 3 with a relatively low sandblast resistance. Thus, sandblast processing can be easily performed in which the adhesive layer is not completely removed by the sandblast processing when the holes 3f are formed. That is, the adhesive layer 5 functions as a stopper in the sandblast processing.

Therefore, it is possible to prevent the semiconductor substrate 2 from being machined by the sandblast processing. If the holes 3f are also formed in the semiconductor substrate 2, the electrode film 7A described above is formed so that the electrode film 7A extends on the inner peripheral surface of the hole formed in the semiconductor substrate 2. If the electrode film 7A extends on the inner peripheral surface of the holes formed in the semiconductor substrate 2, the connection electrodes 8 are defined by the electrode film 7A that extends on side surfaces of the semiconductor substrate, which may cause the characteristics of the semiconductor sensor device 1 to change.

That is, if the connection electrodes 8 extend on the side surfaces of the semiconductor substrate 2, an electrical field may be applied to the semiconductor substrate 2 by the connection electrodes 8 to cause the characteristics to change. In contrast, in this preferred embodiment, the adhesive layer 5 functions as a stopper and the holes 3f are defined so that the holes 3f are not formed in the semiconductor substrate 2. In this manner, the connection electrodes 8 do not extend on the side surfaces of the semiconductor substrate 2.

A manner in which the semiconductor sensor device 1 obtained according to the preferred embodiment described above can be surface-mounted on a mounting substrate using the terminal electrodes 7 will now be described with reference to FIG. 5.

Figure 5:
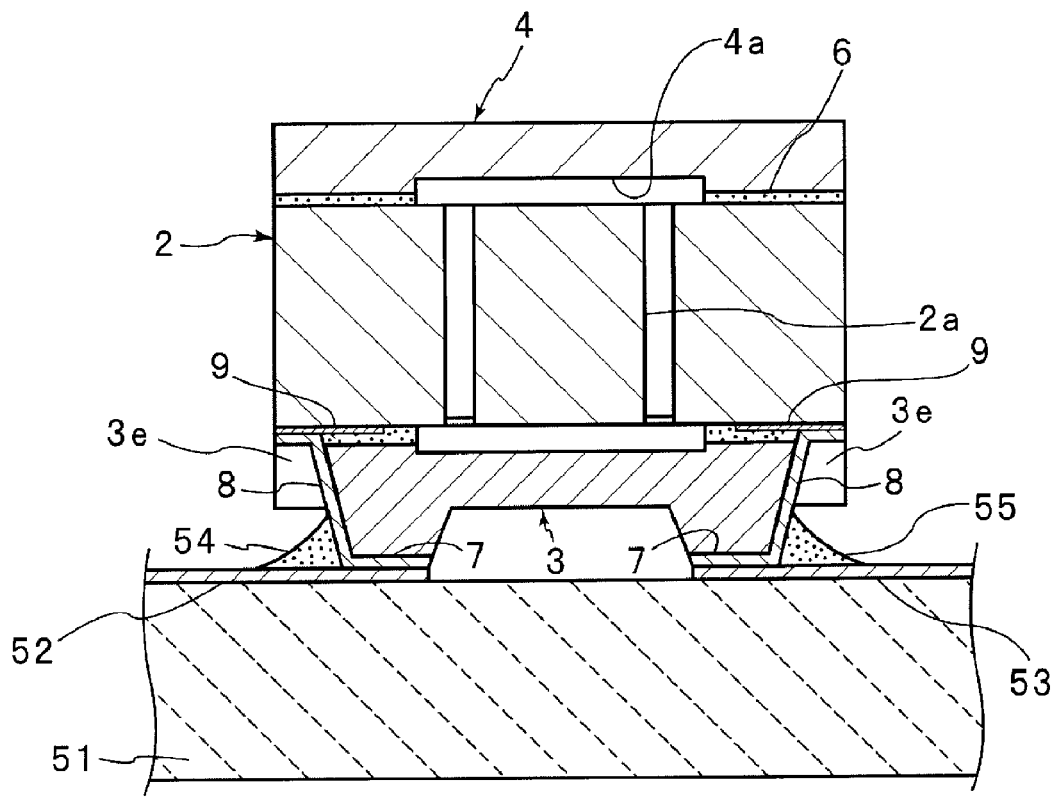
FIG. 5 is a front cross-sectional view showing a state in which the semiconductor sensor device of the preferred embodiment shown in FIGS. 1A to 1E is mounted on a mounting substrate.

As shown in FIG. 5, the semiconductor sensor device 1 is mounted so as to be placed upside down on a mounting substrate 51 so that the terminal electrodes 7 abut the electrode lands 52 and 53 on the mounting substrate 51. The terminal electrodes 7 are bonded to the electrode lands 52 and 53 using, for example, solders 54 and 55. Since, as described above, the projections 3b are made of the same material as the case plate 3 and are integrally formed therewith, the projections 3b are not removed from the case plate 3 even if heat is applied during solder heating. Therefore, the semiconductor sensor device 1 can be firmly bonded to the mounting substrate 51 in the manner shown in FIG. 5 without using an underfill. Thus, the use of an underfill is omitted.

Therefore, the semiconductor sensor device 1 that requires a small mounting space and that can be mounted on the mounting substrate 51 with a sufficient bonding strength is provided. In the semiconductor sensor device 1, no underfill is required, which results in no transmission of stress from the mounting substrate 51 through an underfill. In addition, even if deflection occurs on the mounting substrate 51, stress from the mounting substrate 51 is transmitted to the semiconductor sensor device 1 only through the projections 3b, and the stress is not transmitted to the semiconductor sensor on the semiconductor substrate 2. Therefore, the semiconductor sensor device 1 that is not susceptible to malfunction even when the mounting substrate 51 is deformed is provided.

Next, a schematic structure of the acceleration sensor disposed on the semiconductor substrate 2 will be described.

Figure 6:
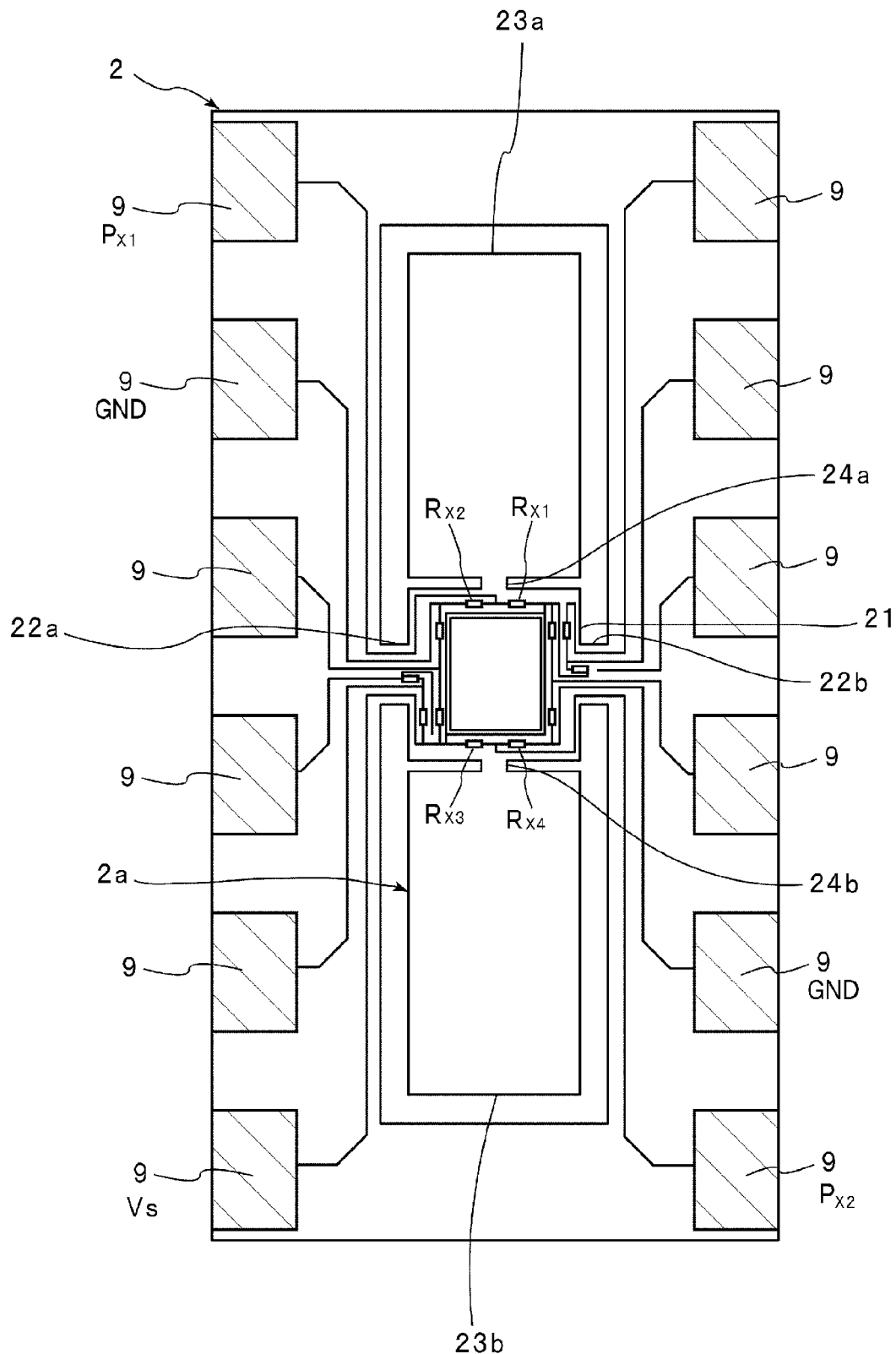
FIG. 6 is a plan view of a semiconductor substrate used in the semiconductor sensor device of the embodiment shown in FIGS. 1A to 1E.
Figure 7:
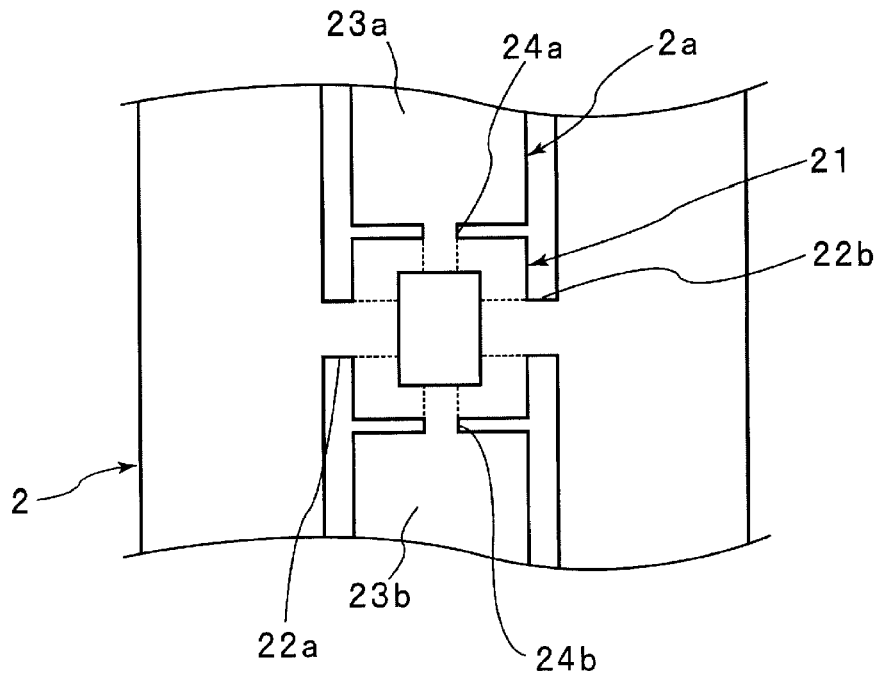
FIG. 7 is a plan view schematically showing a main portion of the semiconductor substrate shown in FIG. 4.

As shown in FIG. 6, a frame-shaped beam section 21 is provided in a floating state in the semiconductor substrate 2. FIG. 7 is an enlarged plan view of a portion in which the beam section 21 is disposed and a portion in which weight sections, which will be described below, are disposed. The beam section 21 has an angled annular shape in plan view. Supporting sections 22a and 22b are arranged continuously so as to extend outward along the X-axis direction from both ends of the beam section 21 in the X-axis direction. Extended ends of the supporting sections 22a and 22b are continuous with a main portion of the semiconductor substrate 2. That is, the supporting sections 22a and 22b enable the beam section 21 to float.

Further, weight sections 23a and 23b are disposed at both sides of the beam section 21 in the Y-axis direction. The weight sections 23a and 23b are coupled to the beam section 21 by coupling sections 24a and 24b that are continuous with the beam section 21 in the Y-axis direction. Therefore, similar to the beam section 21, the weight sections 23a and 23b are disposed in a floating state relative to the main portion of the semiconductor substrate 2. The beam section 21 is deflected, thereby displacing the weight sections 23a and 23b in three axis directions, i.e., the X-axis, Y-axis, and Z-axis directions.

In the present preferred embodiment, the semiconductor substrate 2 is preferably formed by machining an SOI (Silicon-On-Insulator) substrate using a micro-machining technique. The SOI substrate is a multi-layer substrate in which a Si layer, a SiO layer, and a Si layer are laminated in that order. However, the semiconductor substrate used in the present invention is not limited to the SOI substrate.

Figure 8:
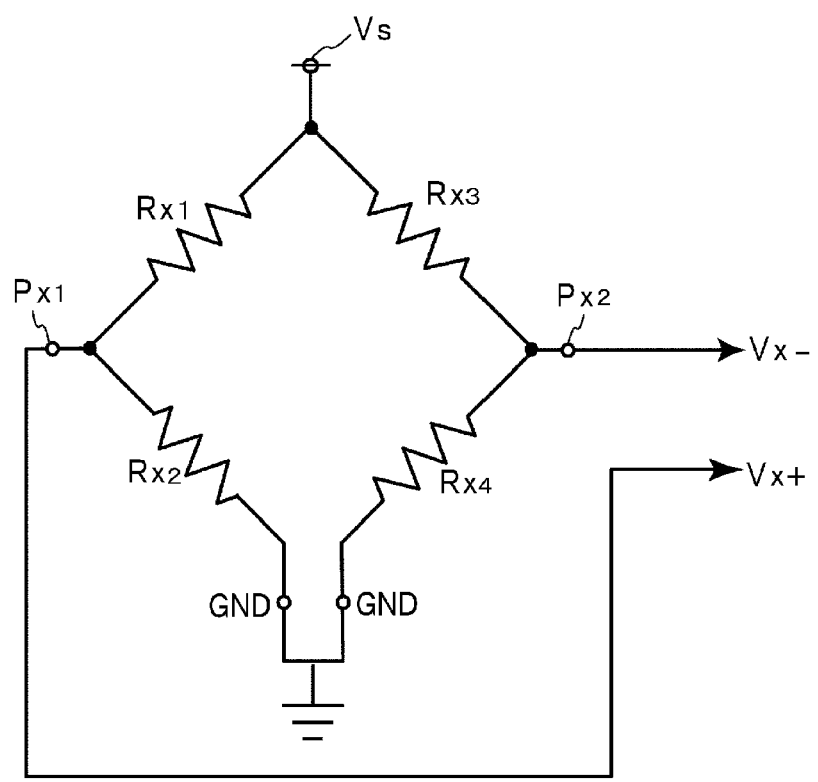
FIG. 8 is a diagram showing an X-axis-direction acceleration detecting circuit defined on the semiconductor substrate shown in FIG. 4.

Further, as schematically shown in FIG. 6, the beam section 21 includes four piezoresistors $R_{x1}$ to $R_{x4}$ for detecting acceleration in, for example, the X-axis direction. The four piezoresistors $R_{x1}$ to $R_{x4}$ define an X-axis-direction acceleration detector for detecting acceleration in the X-axis direction. The piezoresistors $R_{x1}$ to $R_{x4}$ define a bridge circuit shown in FIG. 8 using a wiring pattern defined on the semiconductor substrate 2. The acceleration in the X-direction is detected by an output change in the bridge circuit. As shown in FIG. 8, in the bridge circuit, the piezoresistors $R_{x1}$ and $R_{x2}$ are electrically connected to define a voltage detector $P_{x1}$. Likewise, the piezoresistors $R_{x3}$ and $R_{x4}$ are electrically connected to define a voltage detector $P_{x2}$.

Further, the piezoresistors $R_{x1}$ and $R_{x3}$ are electrically connected, and a connection portion there between defines a voltage input section Vs that is connected to an external voltage source. The piezoresistors $R_{x2}$ and $R_{x4}$ are also electrically connected using an external wiring pattern, and a connection portion there between is connected to a ground potential.

Likewise, four piezoresistors are further arranged to detect acceleration in each of the Y-axis and Z-axis directions, and a bridge circuit similar to the bridge circuit shown in FIG. 8 is defined by connecting the four piezoresistors using a wiring pattern defined on the semiconductor substrate 2.

Figure 9:
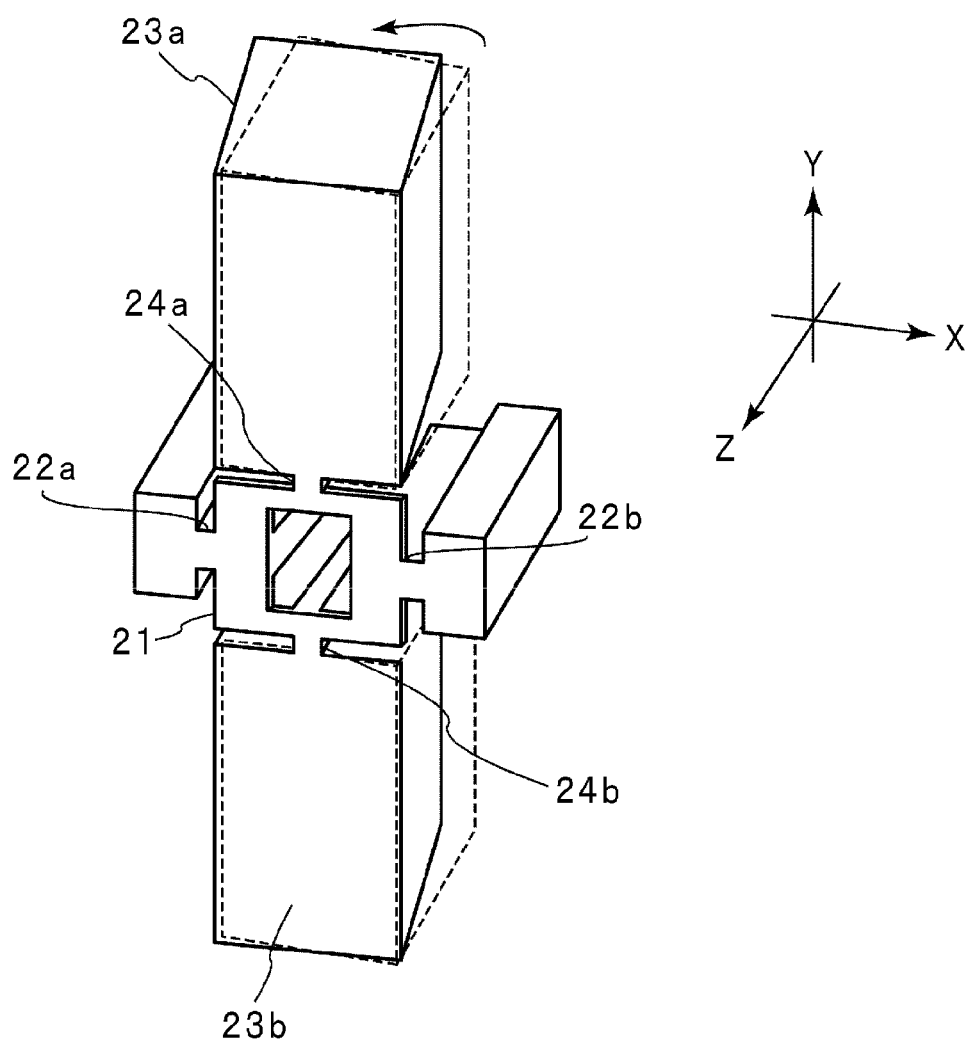
FIG. 9 is a schematic perspective view for showing a manner in which an acceleration sensor disposed on the semiconductor substrate shown in FIG. 4 is displaced.
Figure 10:
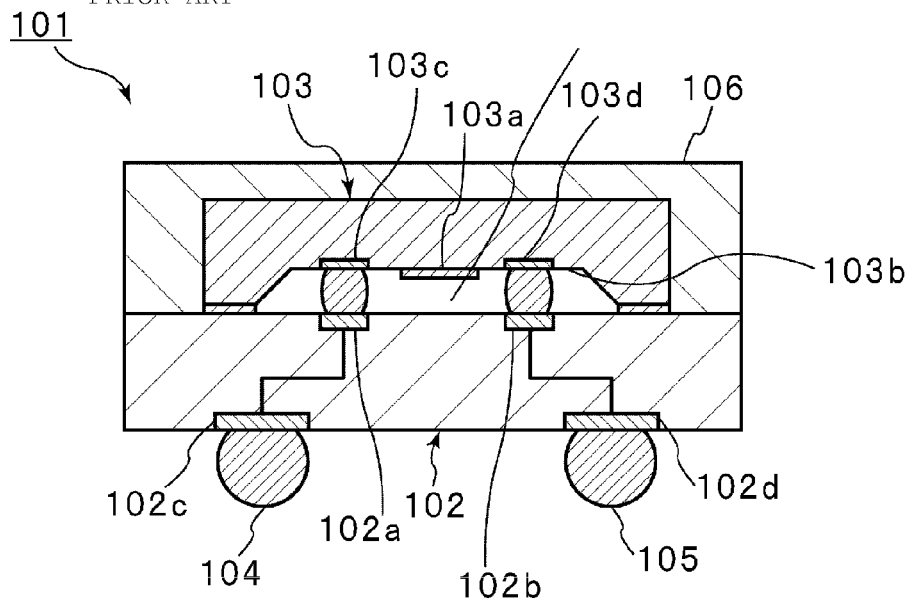
FIG. 10 is a front cross-sectional view showing an example of a known semiconductor device.

When acceleration in the X-axis direction is generated on the semiconductor substrate 2, a force in the X-axis direction caused by the acceleration is exerted on the weight sections 23a and 23b, which correspond to the moving section 2a. The force exerted on the weight sections 23a and 23b in the X-axis direction displaces the weight sections 23a and 23b in the X-axis direction in a manner indicated by, for example, a solid line shown in FIG. 9 from a reference state indicated by a broken line shown in FIG. 9. The displacement of the weight sections 23a and 23b in the X-axis direction causes the beam section 21 to be deflected through the coupling sections, thereby generating stress in the beam section 21. The stress generated in the beam section 21 changes the resistance values of the piezoresistors of the X-axis-direction acceleration detector described above. Therefore, when acceleration in the X-axis direction occurs, the output of the bridge circuit shown in FIG. 8 defining the X-axis-direction acceleration detector changes, and the acceleration in the X-axis direction is detected. In this case, no acceleration is exerted in the Y-axis or Z-axis direction, and no change is observed in the output of the bridge circuits defining the Y-axis-direction acceleration detector or the Z-axis-direction acceleration detector. The acceleration in the X-axis direction is therefore detected.

Likewise, acceleration in the Y-axis or Z-axis direction is detected when acceleration occurs in the Y-axis direction or when acceleration occurs in the Z-axis direction.

In the above-described preferred embodiments, the acceleration sensor is preferably configured as a semiconductor sensor having a moving section on a semiconductor substrate. However, the present invention is not limited to such a semiconductor sensor using an acceleration sensor, and a semiconductor substrate having any semiconductor sensor including a moving section may be used. Examples of semiconductor sensors include, in addition to an acceleration sensor, sensors having a moving section using various semiconductors, such as an angular velocity sensor, an angular acceleration sensor, and a piezoelectric gyro sensor.

In the above-described preferred embodiments, the semiconductor substrate 2 is preferably used as an element substrate. However, in a method for manufacturing an electronic component according to preferred embodiments of the present invention, the element substrate is not limited to a semiconductor substrate, and may be a substrate made of a material other than a semiconductor material. Further, the function section is not limited to a sensor, as described above, and may include a wide variety of function sections that function as various electronic components.

Further, in the above-described preferred embodiments, the second case plate 4 is laminated on the lower surface of the semiconductor substrate 2. However, in the present invention, the second case plate 4 may not necessarily be used. That is, the second case plate 4 may not be provided, and the semiconductor sensor device 1 may be open at an upper surface thereof after the semiconductor sensor device 1 is mounted.

However, the lamination of the second case plate 4 enables that the function section defined on the element substrate to be hermetically sealed. The mechanical strength of the electronic component is also increased.

Further, the second case plate 4 may also include a plurality of projections and terminal electrodes. In this case, an electronic component that can be mounted on a mounting substrate from the case plate side is provided. That is, the electronic component can be mounted regardless of whether it is directed upward or downward.

Further, each of the case plates 3 and 4 may not have the recess 4a, etc. In this case, the thickness of an adhesive layer applied in a frame shape may be increased to define a gap.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing an electronic component, comprising the steps of:
    preparing an element substrate having a function section arranged to provide a function of an electronic component and an external-connection electrode provided on a surface thereof and arranged to electrically connect the function section to an external device;
    bonding a relatively-low-sandblast-resistant case plate to the element substrate using a relatively-high-sandblast-resistant adhesive;
    forming, by sandblast processing, a hole in the case plate so that the adhesive is exposed on a portion of the hole beneath which a portion of the external-connection electrode is defined;
    removing, by etching, an adhesive portion that is exposed in the hole and that is not removed by the sandblast processing to expose the external-connection electrode;
    forming an electrode film so that the electrode film extends on an inner surface of the hole from an outer surface of the case plate and so that the electrode film is electrically connected to the external-connection electrode exposed by removing the adhesive; and
    forming a projection on the outer surface of the case plate, the projection having a leading end surface on which the electrode film extends.

2. The method for manufacturing an electronic component according to claim 1, further comprising the step of, before forming the electrode film, roughening at least a portion of the case plate at which the electrode film is provided.

3. The method for manufacturing an electronic component according to claim 1, wherein the etching is performed by dry etching.

4. The method for manufacturing an electronic component according to claim 1, wherein a polyimide-based adhesive is used as the adhesive.

5. The method for manufacturing an electronic component according to claim 1, further comprising the step of dicing a laminate of the element substrate and the case plate so that the hole is divided, and forming a recess in a side surface of the projection, the recess being defined by a portion of an inner peripheral surface of the hole.

6. The method for manufacturing an electronic component according to claim 1, wherein the case plate is a first case plate, the method further comprising the step of laminating a second case plate on a surface opposite to the side of the element substrate on which the first case plate is adhered.

7. The method for manufacturing an electronic component according to claim 6, wherein the second case plate is bonded to the element substrate by an adhesive.

* * * * *